United States Patent [19]
Matijevic et al.

[11] Patent Number: 6,017,967
[45] Date of Patent: Jan. 25, 2000

[54] ELECTROPLATING PROCESS AND COMPOSITION

[75] Inventors: Egon Matijevic, Potsdam, N.Y.;
Matthias Schultz, Jena, Germany;
Wade Sonnenberg, Upton, Mass.; John J. Bladon; Patrick J. Houle, both of Framingham, Mass.; Thong B. Luong, Springfield, Mass.

[73] Assignee: Shipley Company, L.L.C., Marlborough, Mass.

[21] Appl. No.: 08/626,671

[22] Filed: Apr. 1, 1996

[51] Int. Cl.⁷ .................................................. B01J 13/00
[52] U.S. Cl. .................................. 516/96; 516/9; 516/11; 516/71; 516/77
[58] Field of Search ................ 423/566.1–566.3; 29/DIG. 12; 148/518; 204/DIG. 13; 428/935, 96, 97, 98; 83/929.1; 427/96–99; 205/162–166, 183, 920, 118, 125; 252/500; 430/567, 569, 637, 937; 174/262, 266, 257, 264, 265, 258; 516/96, 9, 11, 71, 77

[56] References Cited

U.S. PATENT DOCUMENTS

| | | |
|---|---|---|
| 4,895,739 | 1/1990 | Bladon . |
| 5,171,659 | 12/1992 | Tsaur et al. ............................. 430/569 |
| 5,210,013 | 5/1993 | Tsaur et al. ............................. 430/567 |
| 5,276,290 | 1/1994 | Bladon .................................... 174/262 |
| 5,667,662 | 9/1997 | Sonnenberg et al. .................. 205/162 |

OTHER PUBLICATIONS

Stavek et al., Chem. Mater. 1992, 4, pp. 545–555.

*Primary Examiner*—Jeffrey Stucker
*Assistant Examiner*—Brett Nelson
*Attorney, Agent, or Firm*—Darryl P. Frickey; Peter F. Corless

[57] ABSTRACT

The invention relates to a metal sulfide dispersion used for electroplating nonconductors such as substrates used for the formation of a printed circuit board. A printed circuit board made using the dispersion could have metallized through-holes comprising electrodeposited copper on the walls of the holes with an adsorbed layer of metal sulfide particles between the circuit board base material and the copper on the walls of the through-holes. The metal sulfide is characterized by spherical particles having a mean diameter of less than 100 nanometers and a particle size distribution where less than 10 percent of the particles within the dispersion have a diameter twice that of the mean diameter of all particles within the dispersion.

6 Claims, 4 Drawing Sheets

ELECTROPLATING PROCESS AND COMPOSITION

BACKGROUND OF THE INVENTION

1. Introduction

This invention relates to electroplating non-conductors. More particularly, this invention relates to improved compositions for electroplating the surface of a non-conductor using a preformed colloid of a metal sulfide. The metal sulfide functions as a base for direct electroplating. The invention is especially useful for the manufacture of printed circuit boards.

2. Description of the Prior Art

Nonconducting surfaces are conventionally metallized by a sequence of steps comprising catalysis of the surface of the nonconductor to render the same catalytic to electroless metal deposition followed by contact of the catalyzed surface with an electroless plating solution that deposits metal over the catalyzed surface in the absence of an external source of electricity. Metal plating continues for a time sufficient to form a metal deposit of the desired thickness. Following electroless metal deposition, the metal deposit is optionally enhanced by electrodeposition of a metal over the electroless metal coating. Electrolytic deposition is possible because the electroless metal deposit serves as a conductive base coating that permits electroplating.

Catalyst compositions useful for electroless metal plating are known in the art and disclosed in numerous publications including U.S. Pat. No. 3,011,920 incorporated herein by reference. The catalyst of this patent consists of an aqueous suspension of a tin-noble or precious (catalytic) metal colloid. Surfaces treated with such catalysts promote the generation of electrolessly formed metal deposits by the oxidation of a reducing agent in an electroless plating solution catalyzed by the catalytic colloid.

Electroless metal plating solutions are aqueous solutions containing both dissolved metal ions and a reducing agent in solution. The presence of both the dissolved metal ions and the reducing agent in solution results in plate-out of metal when in contact with a catalytic metal-tin catalyst. However, the presence of the dissolved metal and reducing agent in solution may also result in solution instability and indiscriminate deposition of metal on containers walls for the plating solution. This may necessitate interruption of the plating operation, removal of the plating solution from its container and cleaning of the walls and bottoms of the containing with an etching solution. Indiscriminate deposition may be avoided by careful control of the plating solution during use by addition of stabilizers to the solution which inhibit indiscriminate deposition, but which also retard plating rate.

Attempts have been made in the past to avoid the use of an electroless plating solution by a direct plating process whereby a metal is deposited directly over a treated nonconducting surface. One such process is disclosed in U.S. Pat. No. 3,099,608, incorporated herein by reference. The process disclosed in this patent involves treatment of the nonconducting surface with a tin-palladium colloid which forms an essentially non-conducting film of colloidal palladium particles over the nonconducting surface. This is the same tin-palladium colloid used as a plating catalyst for electroless metal deposition. For reasons not fully understood, it is possible to electroplate directly over the catalyzed surface of the nonconductor from an electroplating solution though deposition occurs by propagation and growth from a conductive surface, such as the copper cladding used in the fabrication of a printed circuit board. Therefore, deposition begins at the interface of an adjacent conductive surface and the catalyzed nonconducting surface. The deposit grows epitaxially along the catalyzed surface from this interface. Metal deposition onto the substrate using this process is slow. Moreover, deposit thickness is uneven with the thickest deposit occurring at the interface with the conducting surface and the thinnest deposit occurring at a point most remote from the interface.

It is stated that an improvement to the process of U.S. Pat. No. 3,099,608 is described in UK Patent No 2,123,036 B, incorporated herein by reference. In accordance with the process described in this patent, a surface is provided with metallic sites and the surface is then electroplated from an electroplating solution containing an additive said to inhibit deposition of metal on a metal deposit formed during the plating reaction without inhibiting deposition on the metallic sites over the nonconducting surface. This is said to result in preferential deposition over the metallic sites with a concomitant increase in the overall plating rate. In accordance with the patent, the metallic sites are preferably formed in the same manner as in the aforesaid U.S. Pat. No. 3,099,608 —i.e., by immersion of the nonconducting surface in a solution of a tin palladium colloid. The additive in the electroplating solution responsible for inhibiting deposition is described as one selected from a group of dyes, surfactants, chelating agents, brighteners and leveling agents. Many of such materials are conventional additives in electroplating solutions.

There are limitations to the above process. Both the processes of the US and UK patents require conductive surfaces adjacent to the nonconducting surface for initiation and propagation of the electroplated metal deposit. For this reason, the processes are limited in their application to metal plating solutions of nonconducting substrates in areas in close proximity to a conductive surface.

One commercial application of the process of the UK patent is for the metallization of through-holes walls in the manufacture of double sided printed circuit boards by a process known in the art as panel plating. In this application, the starting material is a printed circuit board substrate clad on both of its surfaces with copper. Holes are drilled through the printed circuit substrate at desired locations. For conductivity, the hole walls are catalyzed with a tin-palladium colloid to form the required metal sites on the walls of the through-holes. Since the circuit board material is clad on both of its surfaces with copper and the circuit board base material is of limited thickness, the copper cladding on the surfaces of the circuit board material is separated by the thin cross section of the substrate material. The next step in the process is direct electroplating over the catalyzed hole walls. Since the copper cladding on each surface is separated by the relatively small thickness of the cross section of the substrate, during electroplating, deposition initiates at the interfaces of the copper cladding and the through-hole walls and rapidly propagates into the holes. The hole wall is plated to a desired thickness within a reasonable period of time. Thereafter, the circuit board is finished by imaging and etching operations.

A disadvantage to the above panel plating process is that copper is electroplated over the hole walls and over the entire surface of the copper cladding. The steps following plating involve imaging with an organic coating to form a circuit pattern and removal of copper by etching. Therefore, copper is first electrolytically deposited and then removed by etching, a sequence of steps which is wasteful of plating metal, etchant and time, and therefore, expensive.

The art, recognizing the disadvantages of panel plating, developed a process for manufacturing printed circuit boards known as pattern plating. In this process, a printed circuit board base material is drilled at desired locations to form through-holes. Through-holes are metallized using conventional electroless plating techniques. Electroless copper is plated onto the walls of the through-holes and over the copper cladding. Thereafter, a photoresist coating is formed and imaged to form the circuit pattern. The board is then electroplated with copper depositing on the copper conductors and through-hole walls, but not over the entire surface of the copper cladding. Soldermask is then plated over the exposed copper by immersion plating or electroplating and the remaining photoresist is removed. The copper not protected by the solder is then removed by etching to form the copper circuit.

Pattern plating cannot be used with the metallizing process of the above referenced UK patent. Treatment of copper cladding prior to the application of the photoresist and the development of the photoresist, all as required for pattern plating, requires the use of treatment chemicals that dissolve or desorb tin-palladium colloid from the hole walls. Since removal occurs prior to electroplating, direct electroplating to provide conductive through-holes is impossible.

Further improvements in processes for direct electroplating of nonconductors are disclosed in U.S. Pat. Nos. 4,895,739; 4,919,768 and 4,952,286, each incorporated herein by reference. In accordance with the processes of these patents, an electroless plating catalyst, such as that disclosed in the UK patent, is treated with an aqueous solution of a chalcogen, such as a solution of a sulfur compound, to convert the catalytic surface to a chalcogenide surface. The chalcogenide of the electroless plating catalyst formed by conversion of the surface to a chalcogenide conversion coating is a robust coating. Therefore, plating catalyst is not desorbed from the nonconductive surface by pretreatment or metallization. Consequently, it is possible to pattern plate substrates for formation of printed circuit boards using the process of said patents.

The processes of the aforementioned patents provide a substantial improvement over the process of the UK patent. However, it has also been found that contact of an adsorbed catalytic metal with a chalcogen solution, especially a solution of a sulfur compound, results in formation of a chalcogenide layer on all metal surfaces in contact with the solution. Therefore, if the process is used in the manufacture of printed circuit boards, copper cladding on the printed circuit board base material is converted to a copper chalcogenide as is the catalytic metal. If the copper chalcogenide is not removed prior to plating, it will reduce bond strength between the copper and a metal subsequently deposited over the copper.

In addition to the above, the art of printed circuit board manufacture is moving in the direction of horizontal processing. Equipment for horizontal processing is more compact than equipment used for vertical processing and can accommodate fewer treatment solutions. For this reason, printed circuit board manufacturers are attempting to shorten the process line—i.e., reduce the number of processing steps and treatment solutions required for the manufacture of printed circuit boards.

A shortened process for electroplating using a chalcogenide is disclosed in U.S. Pat. No. 5,276,290 incorporated herein by reference. In accordance with the process disclosed in this patent, a stable colloid of a preformed catalytic chalcogenide is prepared. A non-conducting surface is contacted with the colloid by immersion. The colloidal chalcogenide adsorbs on the surface of the nonconductor. Following adsorption of the colloidal chalcogenide, the nonconductor is electroplated following procedures disclosed in the aforesaid U.S. Pat. Nos. 4,895,739; 4,919,768 and 4,952,286.

The process of U.S. Pat. No. 5,276,290 is an improvement over the earlier processes for plating non-conductors because there are fewer processing steps and metal surfaces do not come into contact with a solution of a chalcogen to form a chalcogenide requiring removal prior to plating. The process of this patent is illustrated by the following sequence for plating through-holes in printed circuit board manufacture and is compared to a conventional plating process requiring electroless metal deposition.

| Conventional Process | Patented Process |
|---|---|
| Step 1 Desmear with chromic or sulfonic acid or plasma; | Step 1 Same; |
| Step 2 clean and condition with detergent type cleaner; | Step 2 same; |
| Step 3 microetch copper cladding; | Step 3 immerse in preformed solution of catalytic chalcogenide; |
| Step 4 catalyst predip; | Step 4 microetch copper cladding; |
| Step 5 catalyze with catalytic colloid; | Step 5 electroplate to full thickness; |
| Step 6 deposit electroless metal; | |
| Step 7 electroplate to full thickness. | |

A reduced number of processing steps results from elimination of the need to separately treat the non-conductor with a colloidal catalytic solution followed by the solution of the chalcogen and by avoidance of an etch step to remove metal chalcogenide formed over metallic surfaces. Also, the process of U.S. Pat. No. 5,276,290 replaces the need for electroless plating with a direct electroplating step eliminating the need for a costly electroless metal plating solution and the associated problems of solution instability and disposal.

Though the process of U.S. Pat. No. 5,276,290 provides the advantages described above, in practice, it has been found that the colloid formed by the process disclosed in the patent, though adequately stable for use as a freshly prepared colloid, is inadequately stable for prolonged storage prior to use. This limits the market for the colloid. Moreover, it has been found that the quality of the metal deposit formed by electroplating using the preformed colloid varies in unpredictable manner. In particular, metal coverage over a surface treated with the preformed colloid and adhesion to the surface is found to vary from batch to batch of preformed colloid thereby further limiting the commercial use of the same.

SUMMARY OF THE INVENTION

The present invention provides further improvements in processes for electroplating nonconductors. The invention is based upon the use of monodispersed, preformed metal sulfide dispersions characterized by particles having uniform spherical geometry and a mean particle size of 100 nanometers (nm) or less.

Fundamental to the invention is the process used to form the monodispersed metal sulfide dispersion. In a preferred embodiment of the invention, the dispersion is formed by controlled double jet precipitation of the reactants into a suitable reactor. Controlled double jet precipitation involves simultaneous metered addition of a cation and an anion solution into a reactor through separate inlets with agitation. The addition rate for each of the two reactant solutions is desirably controlled to avoid an excess of either reactant in the reactor so that the reactants are present in the reactor in essentially the stoichiometric amounts required for the reaction. By control of the reaction conditions, the reaction may be performed in a single step without a requirement for pH adjustment following mixing of the reactants thus avoiding addition of salts to the dispersion which cause dispersion instability. Following addition of the reactants, a steady state is quickly reached after which the size distribution and shape of the particles remains unchanged. In a preferred embodiment of the invention, aggregation of the nanosized particles is inhibited by use of a controlled amount of a surfactant. The surfactant is present in an amount sufficient to stabilize the dispersion against aggregation but is not present in substantial excess.

A stabilized dispersion of the invention provides numerous advantages over the preformed colloids of the prior art. The process for manufacture of the dispersion is rapid and economical. The particles within the dispersion are uniform in size and shape and nanosized. Consequently, the particles are uniformly adsorbed onto the surface of a nonconductor. This leads to a uniform metal deposit over the coating of particles. The dispersion possesses long term stability even at elevated temperatures thereby permitting the dispersion to be sold in commerce and stored prior to use without formation of aggregates and without precipitation of the dispersion.

Accordingly, one object of the invention is to provide a new process for the rapid formation of a stable, uniform aqueous dispersion of essentially spherical monodispersed metal sulfide particles having a mean diameter of 100 nm or less.

A further object of this invention is to provide a new composition of matter comprising a uniform, stable dispersion of essentially spherical monodispersed metal sulfide particles having a mean diameter of 100 nanometers or less.

An additional object of this invention is to provide a method for electroplating using the monodispersed metal sulfide particles of the invention. The invention is especially useful for the formation of printed circuit boards because the small dimensioned particles uniformly adsorb onto the surface of a nonconductor thus providing a uniform metal coating over the surface of the nonconducting portions of the circuit board.

DESCRIPTION OF THE PREFERRED EMBODIMENTS

The subject invention is suitable for manufacture of a variety of commercial articles where a metal deposit is desired over the surface of a nonconductor. However, the invention is especially useful for the fabrication of printed circuit boards. For this reason, the description that follows is directed primarily to printed circuit board manufacture. In the following description, the term "nonconductor" means an article having at least a portion of its surface inadequately conductive for direct electroplating. In the preferred embodiment of the invention, the term "nonconductor" refers to the electrically nonconducting portions of a printed circuit board base material such as a copper clad epoxy or phenolic sheet.

As described above, the invention involves the use of a preformed dispersion of nanometer sized metal sulfide particles having a mean diameter not exceeding 100 nm. The method used to prepare the dispersion provides a dispersion having the requisite small dimension. The dispersion is stable and the particles are of uniform cross section and readily adsorbed onto a substrate to be plated. The dispersion is characterized by particles that are uniform in shape, have a controlled particle size and a controlled particle size distribution. Desirably, particles within the dispersion are spherical and have a mean diameter not exceeding 100 nm where mean diameter is defined as the average diameter of all of the particles within the dispersion. Preferably, the mean diameter varies between 1 and 50 nm and more preferably, between 2 and 25 nm. Particle size distribution refers to the range of particle sizes within the dispersion. A small particle size distribution is desired—i.e., most particles are of about the same size. In this respect, it is preferred that no more than 10 percent and preferably, no more than 5 percent of the particles within the dispersion have a diameter twice that of the mean diameter of all particles within the dispersion. More preferably, less than 2 percent of the particles have a mean diameter in excess of 3 times the diameter of all particles within the dispersion.

Figure 2:
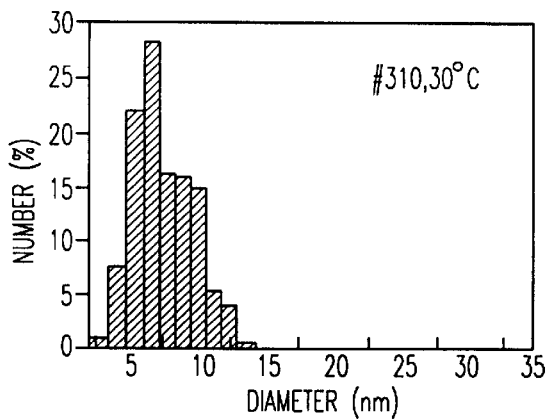
FIGS. 2 to 7 are bar graphs representing particle size distribution of a metal sulfide as a function of reaction temperature.
Figure 3:
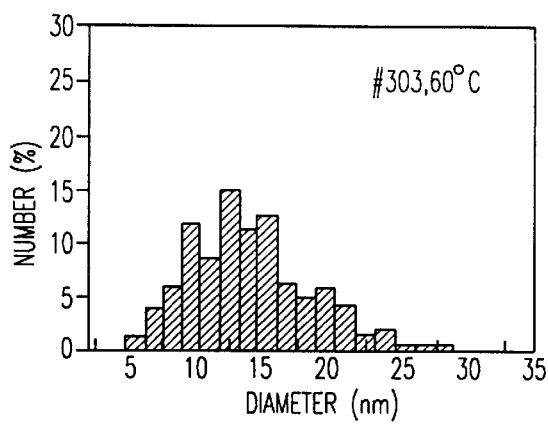
Figure 4:
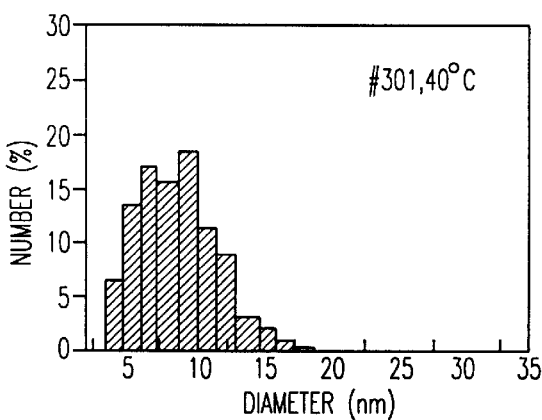
Figure 5:
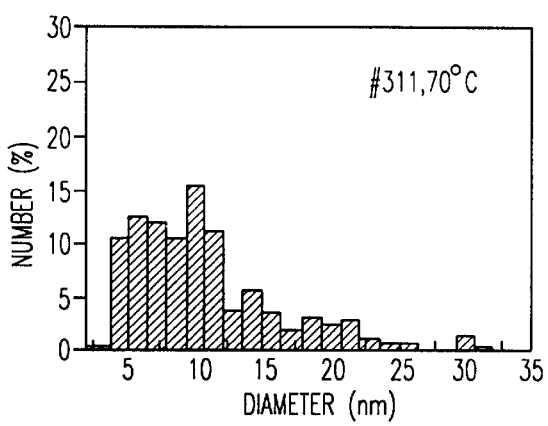
Figure 6:
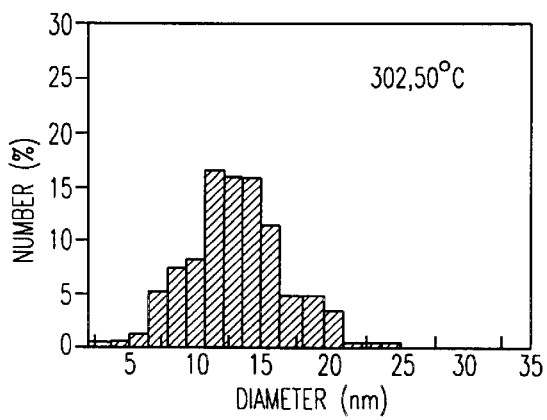
Figure 7:
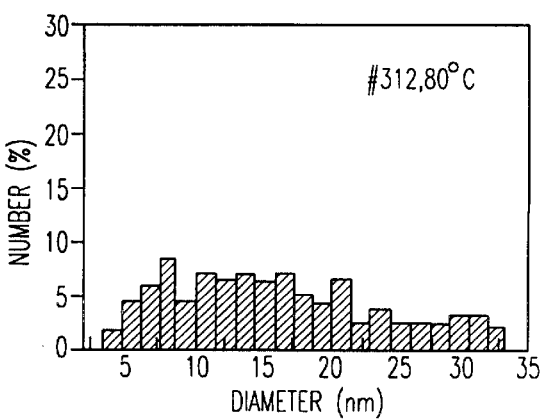

Variation in particle size distribution is shown in FIGS. 2 to 7 of the drawings. The distribution analysis illustrated is based upon Example 2 below which illustrates a method for formation of a copper sulfide dispersion. In this instance, the variation in particle size distribution is as a consequence of reaction temperature. FIG. 2 represents a dispersion having the most desired particle size distribution and FIG. 7 a dispersion having the least desired distribution. In general, FIGS. 2 to 7 represent a gradation from the most preferred dispersion to the least preferred dispersion in descending order. The dispersion of FIG. 2 shows a high concentration (about 28%) of particles having a mean particle size of about 7 nm with all of the particles varying between about 1 and 15 nm. In comparison, the particle size distribution shown in FIG. 7 shows no sharp peak with the particles varying in size between about 2.5 and 33 nanometers.

As described above, a preferred method for formation of a nanosized dispersion of metal sulfide particles comprises controlled double jet precipitation. Preparation of monodispersed particles by controlled double jet precipitation is disclosed by Stavek et al, Chem. Mater. 1992, 4, 545–555, incorporated herein by reference. Prior to the subject invention, it is believed that the controlled double jet precipitation method described by Stavek et al had not been published for formation of nanosized particles and could not be so used for such purpose because of the failure of Stavek et al to disclose the use of a surfactant in the dispersant solution to stabilize the particles within the dispersion formed. The use of a surfactant will be described in greater detail below.

Figure 1:
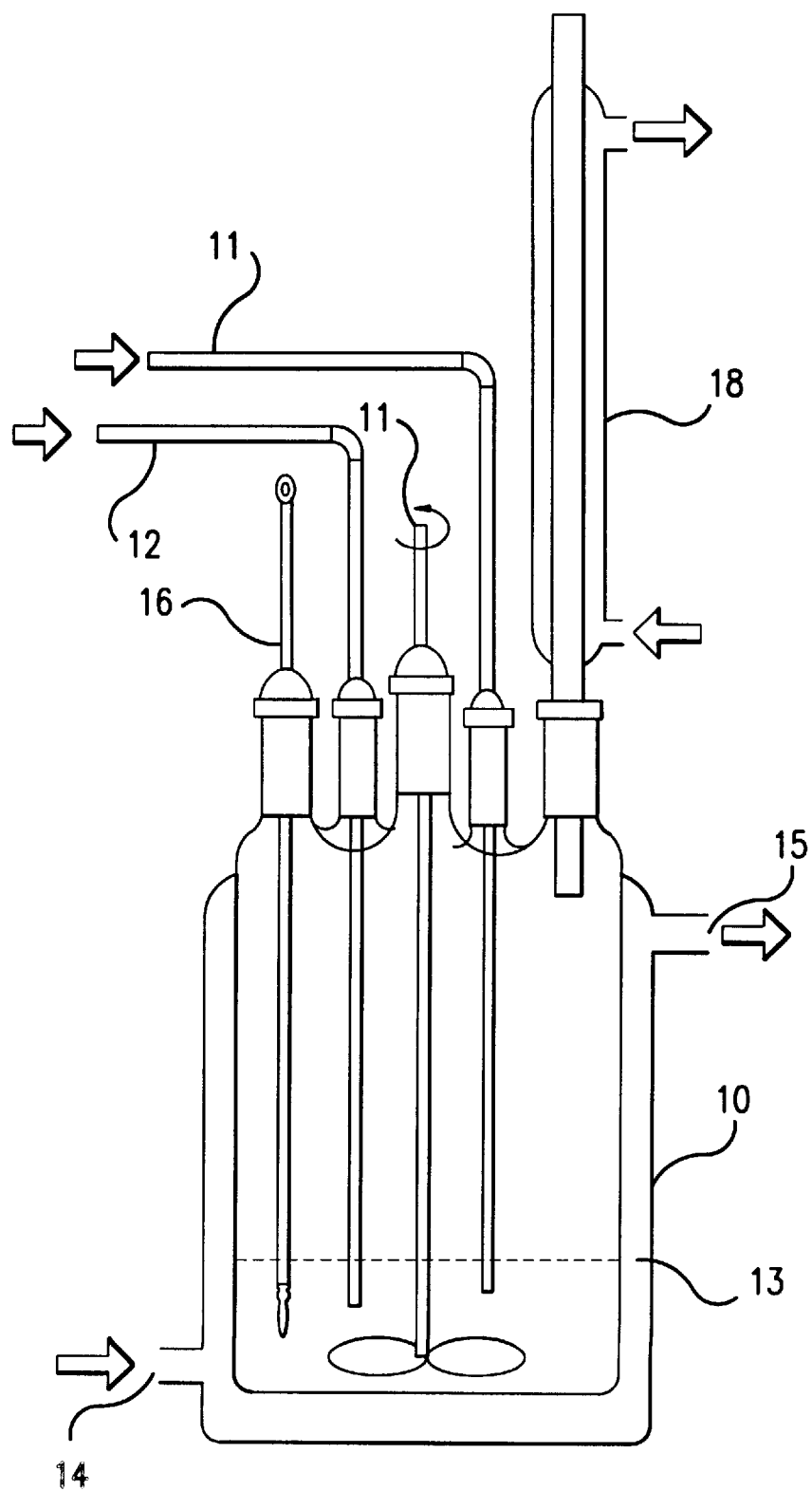
FIG. 1 represents a reactor suitable for controlled double jet precipitation of the dispersion of the invention.

The process of the invention comprises controlled addition of separate solutions of the reactants—i.e., the anion and cation solutions, to a reactor containing a dispersant for the particles formed. A device for formation of the monodispersed metal dispersion by controlled double jet precipitation is shown in FIG. 1 of the drawings. As shown, a reactor 10 is provided with inlet lines 11 and 12 for introduction of reactants. The reactor is equipped with heating jacket 13 having inlet 14 and outlet 15 for temperature control of the reaction as desired. The reactor is further equipped with a thermometer 16 and stirring rod 17. The reactor may also be equipped with condenser 18 to prevent evaporation of dispersant from the reactor.

In use, the reactor is charged with a suitable liquid dispersant for the particles, typically an aqueous dispersant solution desirably containing a surfactant. The stirring rod is used to agitate the dispersant. Temperature is regulated to the desired reaction temperature. The reactants are introduced into the reactor through their respective feed lines. Addition of the reactants is by slow metering into the reactor using control means such as a peristaltic pump (not shown). Flow rate is dependent upon the size of the reactor. For example, using 100 ml of dispersant for purposes of illustration, the reactants may be fed to the reactor at a rate of from about 0.01 to 1.0 moles per minute and preferably, in the stoichiometric ratio required to form a precipitate. The reaction continues until all of the reactants are fed into the reactor. Stirring is continued after completion of the reaction, typically for a time of from 5 minutes to 1 hour.

The reactants are solutions of an anion and cation capable of reacting to form the desired particle. For purposes of this invention, the reactants are capable of forming metal sulfides, preferably noble metal sulfides. Reactants capable of forming palladium sulfide are especially preferred. Each reactant is dissolved in an aqueous solution. Each of the cation and anion solutions may contain the ion in a concentration range of from about 0.00001 to 0.1 moles per liter and more preferably, within a range of from about 0.005 to 0.05 moles per liter. The feed rate of each to the reactor is dependent upon the stoichiometry of the reaction and the concentration of the reactant in the solution. The dispersant solution is preferably water containing a surfactant and a pH adjuster as necessary. Preferred metallic cations are noble metals, especially platinum and palladium. Copper and nickel may be used but they are lesser preferred. In general, any metal ion capable of reacting with a sulfur compound to form a metallic sulfide particle essentially as electrically conductive as palladium sulfide is suitable.

The use of a surfactant in the preparation of the dispersion is especially useful as it prevents aggregation and growth of the particles as they are formed in the dispersant and further, immediately stabilizes the particles within the dispersion. The surfactant is desirably an anionic or nonionic surfactant though amphoteric surfactants may also be used. Typical anionic surfactants include carboxylates, sulfonates, sulfates and phosphates of long chain hydrocarbon hydrophobes such as a carbon chain having from 10 to 50 carbon atoms. Nonionic surfactants include polyoxyalkylenes, carboxylic acid esters, carboxylic amides, polyalkylene oxide block copolymers derived from propylene, butylene, styrene, etc. Other suitable surfactants include those disclosed in the above referenced UK patent No. 2,123,036 B. Preferred surfactants comprise polymeric alkoxylated surfactants having an HLB in excess of 10, preferably in excess of 12 and most preferably in excess of 15 and conforming to the following formula:

where R is a hydrocarbon group having from 1 to 40 carbon atoms, m and m' differ from each other and each is one or more whole integers of from 2 to 4, preferably 2 or 3, and a and b are whole integers varying between 0 and 1000 provided that a +b is at least 3, preferably between 7 and 50. R may be aliphatic or aromatic. Exemplary aliphatic groups are ethyl, propyl, butyl, octyl, decyl, dodecyl, etc. Exemplary aromatic groups are benzyl and naphthyl, especially alkyl substituted benzyls. The formula above is intended to include copolymers such as mixed alkylene oxide including copolymers containing ethylene oxide and propylene oxide blocks.

Another class of preferred stabilizers are electrosteric stabilizers having the requisite HLB and an ionic charge chemically bonded to the end of a hydrophilic nonionic moiety and at least twenty ethylene oxide groups in its chain conforming to the following structural formula:

where R, m, m', a and b are as defined above, R' is an alkyl group having from 1 to 8 carbon atoms, A is an anion such as carboxylate, phosphate, sulphonate, etc., and M is a counteracting cation such as an alkali metal inclusive of sodium and potassium; ammonium; or an alkaline earth metal such as calcium or magnesium. A more preferred stabilizer within the above class is one where R is alkyl having from 10 to 20 carbon atoms, A is $-SO_3$, n is an odd number and M is sodium.

A preferred stabilizer within the above class of materials conforms to the formula:

where m" is a whole integer ranging between 3 and 20, M is an alkali metal and n varies between 3 and 1,000 and preferably, between 7 and 50.

Other surfactants suitable for use in accordance with the invention include alkylphenol ethoxylates, alcohol ethoxylates, tristrylphenol ethoxylates, mercaptan ethoxylates, all sold under the trade name Ipegal or Rhodasurf, and oleyl alcohol ethoxylates also sold under the Rhodasurf tradename. A particularly useful class of stabilizers are alkylene oxides having at least 3 and preferably in excess of 10 allylene oxide repeating groups. The alkylene oxide group is desirably selected from ethylene oxides, propylene oxides and mixtures.

With respect to HLB values given above, it should be understood that the numerical values given are for systems utilizing water as the dispersant for the conductive particles. If a water miscible organic solvent such as an alcohol is added to the dispersant for the particles, the polarity of the dispersant will normally be reduced. The desired HLB of the stabilizer should be altered, typically reduced, in proportion to the reduction in the polarity of the dispersant. The change in HLB may have to be determined by routine experimentation.

The concentration of the stabilizer in suspension may vary from about 0.1 to 20 parts by weight per part of dispersed phase and preferably varies between about 0.5 and 2 parts per part of dispersed phase. Preferably, and where possible, the suspending agent is added to the dispersant prior to formation of the particles whereby the particles are stabilized as they are formed.

Figure 8:
FIG. 8 is an electron micrograph of a palladium sulfide dispersion formed in accordance with the preferred method of the invention.
Figure 9:
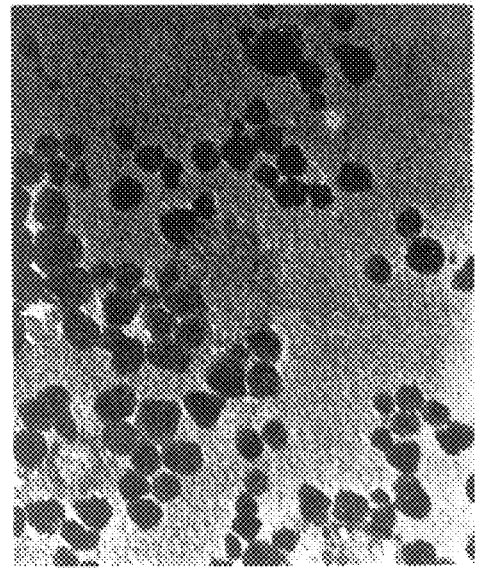
FIG. 9 is an electron micrograph of a copper sulfide dispersion formed in accordance with the preferred method of the invention.

The dispersion formed following the procedures described above generally comprises spherical particles. The spherical nature of palladium sulfide particles is shown in FIG. 8 of the drawings which is a transmission electron micrograph of a palladium sulfide dispersion made by the procedure of Example 1. From the figure, it can be seen that the particles are spherical, of relatively uniform dimension and separated from each other. The particles shown in FIG. 8 have a mean particle size of from 20 to 30 nanometers. Similarly, FIG. 9 is a transmission electron micrograph of a copper sulfide dispersion formed by the procedures of the invention. The micrograph shows that the particles are of regular spherical shape and dimension.

The following description illustrates the manner in which the colloid of the metal sulfide may be used in printed circuit board manufacture. For such manufacture, the substrate commonly used is an epoxy substrate filled with glass fibers and copper clad on at least one of its surfaces. As is known in the art, the epoxy may be mixed with other resins for specific purposes.

In the manufacture of a double sided printed circuit board, a first step comprises the formation of through-holes by drilling or punching or any other method known to the art. Following formation of the holes, it is desirable to employ the conventional step of desmearing the holes (step 1 above) using sulfuric acid or chromic acid or by plasma etching or etch back of the holes with chromic acid. Following desmearing or etch back of the holes, the circuit board base material is conventionally treated with a glass etch that removes glass fibers extending into the holes from the hole walls. This is followed by a solution that cleans the copper surface and conditions the hole wall to promote catalyst adsorption. Such solutions are often referred to as cleaner conditioners and typically comprise an aqueous alkaline surfactant solution for cleaning soil and a polyamine or quaternary amine to condition the hole wall and impart a positive charge to facilitate adsorption of a negatively charged colloidal catalyst. This treatment step, by itself, is old in the art and does not constitute a part of the invention. Proprietary cleaner conditioners are commercially available, and a suitable material is available from Shipley Company, L.L.C. of Marlboro Mass. and identified as cleaner conditioner 231

Following the above preparation steps, the processing sequence of the invention may be employed. The next step in the process comprises immersion of the part to be plated in the solution of the preformed nanosized metal sulfide dispersion. Exemplary metals are platinum, palladium, nickel and copper. Palladium is most preferred. Copper is desirable but it has been found to possess marginal conductivity.

The treatment conditions for immersion of a part in the preformed colloid of the metal sulfide are not critical. Preferably, treatment times vary from about 30 seconds to 15 minutes and more preferably, vary between about 2 and 6 minutes. The temperature may vary from room temperature to near the boiling point of the colloidal formulation, but room temperature treatment is preferred.

Treatment with the preformed dispersion results in the formation of an adsorbed layer of particles over the nonconductor surface. The adsorbed layer darkens the surface. The coating is suitable for direct electroplating. If the nonconductor is a copper-clad printed circuit base material, the copper cladding should be cleaned such as, for example, by use of a sulfuric acid-hydrogen peroxide etchant. The etchant should be used at room temperature for a period of time ranging between about 1 and 3 minutes. It should be noted that unexpectedly, treatment with the etchant does not result in attack on the metal sulfide adsorbed onto the surface of the nonconductor.

The next step in the process comprises electroplating directly over the adsorbed layer of the metal sulfide. The electroplating procedure is similar to the procedure disclosed in the above referenced UK Patent, but the careful control of electroplating conditions required in the UK Patent are not necessary in the process of this invention. The electroplating process may use electroplating solutions such as those disclosed in the UK Patent, but most commercially available electroplating solutions contain additives which make the same suitable for the process of the invention. The preferred electroplating metals in accordance with the invention are copper and nickel though the process is suitable for electroplating of any desired metal. A typical electroplating solution comprises an aqueous acid solution of the metal desired to be plated together with proprietary additives from the group of dyes, surfactants, chelating agents, brighteners, leveling agents, etc. Typical acids used in the formulation of said baths comprise those with a high ionic dissociation constant for maximum conductivity such as sulfuric acid, fluroboric acid, sulfamic acid, etc. Dyes typically used in such baths include methylene blue, methyl violet, and other n-heterocyclic compounds. Suitable surfactants included in such baths typically include nonionic surfactants such as alkyl phenoxy polyethoxyethanols, wetting agents and water soluble organic compounds such as compounds containing multiple oxyethylene groups have been found to be effective. A preferred group of such compounds include polyoxyethylene polymers having from as many as 20 to 150 repeating units. Also included in this class of materials are block copolymers of polyoxyethylene and polyoxypropylene. The additives described above are added to the solution in conventional concentrations.

The electroplating procedure is conventional. A part to be plated is used as a cathode in a conventional electroplating cell. Current density is conventional and varies typically within a range of from 5 through 40 amps per square foot, depending upon the diameter of holes to be plated, the thickness of the board and the composition of the electroplating solution used. The plating solution is maintained at a temperature ranging between room temperature and about 100° F. Plating is continued for a time sufficient to form a deposit of desired thickness. For circuit board manufacture, a typical thickness may range between 0.5 and 2.0 mils, typically from 1 to 1.5 mils. A plating time of from 15 to 90 minutes would typically be required to obtain a deposit of the preferred thickness within the preferred range of current densities. The deposit formed by the process is uniform in thickness, free of defects and strongly bonded to the surface of the nonconductor over which it is plated. Bond strength is satisfactory to withstand soldershock testing as conventionally used in printed circuit board manufacture.

The chemical resistance of an adsorbed metal sulfide coating to treatment solutions conventionally used in printed circuit manufacture permit simplified printed circuit board manufacturing processes impractical or inoperative in the prior art. For example, a pattern plating sequence, as described above, could not be used with the direct electroplating process of the UK patent because the pretreatment steps would remove or dissolve adsorbed colloid thereby making it impossible to first treat and image and then electroplate. This is a serious disadvantage because it severely limits the type of circuit board that can be fabricated using the process of the UK patent. The adsorbed sulfide of the subject invention remains unaffected when contacted with treatment chemicals required for pattern plating. Therefore, a pattern plating process for formation of a circuit board is possible using the process of the subject invention. Such a process is illustrated in the sequence of steps described below using a predrilled and desmeared copper clad circuit board base material:

| Pattern Plating Sequence | |
| --- | --- |
| Step 1 | clean and condition; |
| Step 2 | treat with sulfide colloid; |
| Step 3 | acid clean copper cladding; |
| Step 4 | apply and image photoresist; |
| Step 5 | develop photoresist image; |
| Step 6 | clean and microetch copper cladding; |
| Step 7 | electroplate; |
| Step 8 | apply solder resist; |
| Step 9 | strip photoresist; and |
| Step 10 | remove copper bared by removal of photoresist. |

Pattern plating is possible in accordance with the invention because etchants and alkaline developers used to develop the photoresist layer do not adversely affect or inactivate the adsorbed sulfide colloid. These same materials would inactivate, desorb or dissolve a palladium tin colloidal catalyst used for direct electroplating in the process of the UK patent.

Figure 10:
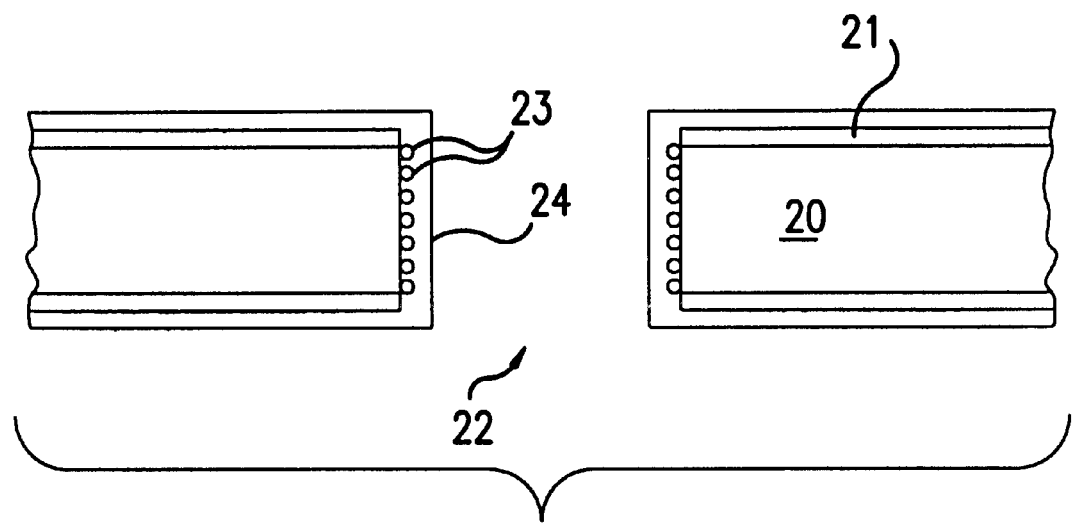
FIG. 10 is a printed circuit board base material used for formation of printed circuit boards in accordance with the process of the invention.

The invention will be better understood by reference to the examples that follow where, unless stated otherwise, the substrate treated was an epoxy copper clad circuit board base material provided with a random array of through-holes. In FIG. 10 of the drawing, there is illustrated a segment of an epoxy circuit board base material with a through hole therein. The epoxy base material 20 is clad on both surfaces with copper cladding 21. The hole is represented by opening 22. The hole wall has a coating of preformed metal sulfide particles 23. This is plated with electroplated copper coating 24, which overlies copper cladding 21 and the particulate sulfide 23. Commercial formulations used in the examples are available from Shipley Company, L.L.C. of Marlborough, Mass.

EXAMPLE 1

For this example, a double jet precipitator (as illustrated in the drawings) having a volume of 300 cm$^3$ had added to it 100 cm$^3$ of an aqueous solution of 1.50 g of Avanol surfactant S-150, an ethoxylated sulfonate having ethylene oxide chain lengths of 15. Using peristaltic pumps, 50 cm$^3$ of a 0.020 mol dm$^{-3}$ PdCl$_2$ solution acidified with 0.1 cm$^3$ of concentrated HCl and 50 cm$^3$ of 0.020 mol dm$^{-3}$ Na$_2$S solution were separately fed to the reactor at a rate of 10 cm$^3$ per minute. The system was stirred at 600 rpm at room temperature. A dispersion was formed having spherical PdS particles with a diameter of 20 ±3 nm. An electronmnicgraph of these particles is shown in FIG. 8 of the drawings. The so prepared dispersion was stable. No aggregation or settling was observed after aging the dispersion for four weeks in an oven at 49° C.

COMPARATIVE EXAMPLE 1

A reactor had added to it 100 cm$^3$ of an aqueous solution of 1.5 g of the Avanol S-150 surfactant, 49.9 cm$^3$ of 0.020 mol dm$^{-3}$ PdCl$_2$ solution and 0.1 cm$^3$ of concentrated HCl. Thereafter, 50 cm$^3$ of 0.020 mol dm$^{-3}$ Na$_2$S solution was added to the reactor at a rate of 10 cm$^{-3}$ per minute, while the dispersion was stirred at 600 rpm at room temperature. A dispersion was formed having particles with an irregular shape which aggregated into clumps within a short period of time.

EXAMPLE 2

The procedure of Example 1 was repeated six times using 50 cm$^3$ of 0.050 mol dm$^{-3}$ CuSO$_4$ and 50 cm$^3$ of a 0.050 mol dm$^{-3}$ Na$_2$S solution introduced by means of peristaltic pumps into 100 cm$^3$ aqueous solution containing 1.5 g of the Avanol S-150 surfactant solution. Each experimnent differed in reaction temperature. The reaction temperatures used were 30° C., 40° C., 50° C., 60° C., 70° C. and 80° C. Particle size distribution for the so formed colloids was determined and is illustrated in FIGS. 2–7 of the drawings. FIG. 9 of the drawings in an electron micrograph of particles formed at 30° C.

EXAMPLE 3

Using the procedure of Example 1, 0.020 mol dm$^{-3}$ °f Na$_2$[PdCl$_4$] was substituted for the PdCl$_2$ solution without addition of HCl. The colloid formed exhibited the same adsorption and stability properties as the colloid of Example 1.

EXAMPLE 4

The procedure of Example 1 was repeated with the introduction of 50 cm$^3$ of a 0.010 mol dm$^{-3}$ PdCl$_2$ solution containing 0.05 cm$^3$ HCl and 50 cm$^3$ of a 0.010 mol dm$^{-3}$ Na$_2$S into 100 a cm$^3$ aqueous solution containing 7×10$^{-4}$ mol dm$^{-3}$ NaOH and 0.004 mol dm$^{-3}$ cetyl trimethyl ammonium bromide. The average size of PdS particles so prepared was smaller ranging between 3 and 5 nm and was stable.

EXAMPLE 5

A copper clad epoxy board material having an array of through holes having diameters of 14, 18 and 24 mils was prepared for plating by contact with a pretreatment solution identified as cleaner conditioner 231 available from Shipley Company, L.L.C. and containing a proprietary amine surfactant and water rinsed. The cleaner conditioner cleans the copper and imparts a positive charge to the surface of the board. Treatment is by immersion for 5 minutes in the treatment solution maintained at about 45° C. The so treated board is then immersed in the palladium sulfide colloid formed by the process of Example 1. Treatment is for 5 minutes in the colloidal suspension maintained at a temperature varying between 25 and 30° C. Following treatment with the colloidal suspension of palladium sulfide, there is some darkening of copper indicating the formation of copper sulfide. This is removed by immersion of the substrate in a peroxide sulfuric etchant identified as Pre-etch 746 etchant for 30 to 60 seconds at room temperature. Thereafter. the part is water rinsed and electroplated from an acid copper electroplating bath identified as Electroposit 892 acid copper at a current density of 15 amps/sq. ft. and at a temperature of 70° F. for three minutes. Complete coverage with electrolytic copper occurs after only 3 minutes though the longer plating time was used to permit deposition of an adequately thick layer of copper.

EXAMPLE 6

The preformed palladium sulfide colloid of Example 1 was stored in an oven maintained at 120° F. for 20 days. No precipitation nor aggregation was observed following this storage.

Examples 1 and 3 constitute the currently preferred embodiment of the invention.

We claim:

1. A method for formation of a stable aqueous dispersion of a metal sulfide, said method comprising the step of separately injecting a solution of metal ions and a solution of a sulfur compound into a reactor containing a dispersant and a stabilizer having at least three alkylene oxide groups in a chain and a hydrophilic—lipophilic balance (HLB) in excess of 12, said stabilizer being present in a concentration sufficient to stabilize the dispersion of said metal sulfide, the flow rate of the reactants into the reactor being controlled so as to form a dispersion comprising spherical particles where the particles have a mean diameter of less than 100 nanometers and a particle size distribution where less than 10 percent of the particles within the dispersion have a diameter twice that of the mean diameter of all particles within the dispersion.

2. The method of claim 1 where the reactants are injected into the reactor in the stoichiometric ratio necessary to form the metal sulfide.

3. The method of claim 1 where the metal sulfide is palladium sulfide.

4. The method of claim 1 where the mean diameter of particles formed varies within a range of from 1 to 50 nm.

5. The method of claim 1 where less than 5 percent of the particles within the dispersion have a diameter twice that of the mean diameter of all particles within the dispersion.

6. The method of claim 1 wherein the stabilizer is a copolymer containing ethylene oxide and propylene oxide blocks.

* * * * *